US011502206B2

(12) United States Patent
Shibata (10) Patent No.: US 11,502,206 B2
(45) Date of Patent: Nov. 15, 2022

(54) SEMICONDUCTOR WAFER MANUFACTURING METHOD AND SEMICONDUCTOR DEVICE

(71) Applicant: LAPIS SEMICONDUCTOR CO., LTD., Kanagawa (JP)

(72) Inventor: Hiroshi Shibata, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/667,498

(22) Filed: Oct. 29, 2019

(65) Prior Publication Data

US 2020/0135939 A1    Apr. 30, 2020

(30) Foreign Application Priority Data

Oct. 31, 2018  (JP) .............................. JP2018-206084

(51) Int. Cl.
| | |
|---|---|
| *H01L 29/94* | (2006.01) |
| *H01L 21/02* | (2006.01) |
| *H01L 27/02* | (2006.01) |
| *H01L 49/02* | (2006.01) |

(52) U.S. Cl.
CPC ........ *H01L 29/945* (2013.01); *H01L 21/0201* (2013.01); *H01L 27/0207* (2013.01); *H01L 28/40* (2013.01)

(58) Field of Classification Search
CPC ............... H01L 29/945; H01L 21/0201; H01L 27/0207; H01L 28/40; H01L 28/90
See application file for complete search history.

(56) References Cited

U.S. PATENT DOCUMENTS

| | | | |
|---|---|---|---|
| 6,853,024 B1* | 2/2005 | Tu | ...................... H01L 27/10852 257/305 |
| 2008/0197397 A1 | 8/2008 | Parthasarathy et al. | |
| 2009/0101957 A1* | 4/2009 | Cheng | ................. H01L 27/0805 257/E29.345 |
| 2010/0155801 A1* | 6/2010 | Doyle | ............... H01L 27/10894 257/301 |
| 2012/0049320 A1* | 3/2012 | Parsey, Jr. | ........... H01L 27/0207 257/528 |
| 2013/0161792 A1 | 6/2013 | Tran et al. | |

FOREIGN PATENT DOCUMENTS

| | | |
|---|---|---|
| JP | 2004-266140 A | 9/2004 |
| JP | 2006-295048 A | 10/2006 |
| JP | 2008-205439 A | 9/2008 |
| JP | 2018-022787 A | 2/2018 |

OTHER PUBLICATIONS

Japanese Notice of Reasons for Refusal, Japanese Application No. 2018-206084, dated Aug. 23, 2022, 8 pgs.

* cited by examiner

*Primary Examiner* — Sarah K Salerno
(74) *Attorney, Agent, or Firm* — Volentine, Whitt & Francos, PLLC (57) ABSTRACT

A semiconductor wafer manufacturing method including: forming a plurality of trench capacitors at a main surface of a semiconductor wafer, wherein each of the plurality of trench capacitors is configured as unit cells that internally include unit trench capacitors, and wherein a length component in a predetermined direction of a layout pattern of trenches of the plurality of trench capacitors is made equivalent, within a fixed tolerance range, to a length component in a direction that intersects the predetermined direction.

9 Claims, 6 Drawing Sheets

PRIOR ART

FIG.6B

PRIOR ART

FIG.6C

PRIOR ART

SEMICONDUCTOR WAFER MANUFACTURING METHOD AND SEMICONDUCTOR DEVICE

CROSS-REFERENCE TO RELATED APPLICATION

This application is based on and claims priority under 35 USC 119 from Japanese Patent Application No. 2018-206084, filed on Oct. 31, 2018, the disclosure of which is incorporated by reference herein.

BACKGROUND

Technical Field

The present disclosure relates to a semiconductor wafer manufacturing method and a semiconductor device that includes a trench capacitor.

Related Art

In relation to a semiconductor device that includes a trench capacitor, Japanese Patent Application Laid-Open (JP-A) No. 2004-266140 discloses a method of manufacturing a semiconductor device. This method includes a step in which trenches are formed in one surface of a semiconductor substrate, a step in which an insulation film is formed on an inner wall of the trenches, and a step in which an electro conductive film is formed inside the trenches via the insulation film. Further, in the above method, after the step to form the electro conductive film, a step in which heat processing is performed on the insulation film at a temperature that enables distortion within the insulation film to be removed.

In addition, Japanese Patent Application Laid-Open (JP-A) No. 2006-295048 discloses a semiconductor device. This semiconductor device includes a semiconductor substrate having a plane orientation (100) surface, and plural memory cells that are formed on the semiconductor substrate. The plural memory cells include a capacitor that is formed in trenches extending from the surface to an interior of the semiconductor substrate, and a transistor having a first source/drain area that is connected to the capacitor, a second source/drain area that is formed by providing a partition between this second source/drain area and the first source/drain area and that is connected to a bit line, and a gate electrode that is formed on the partition between the first and second drain/source areas and that is connected to a word line. Further, in this semiconductor device a horizontal cross-section of at least a portion of the trenches is square, and a horizontal cross-section of the trenches of the plural memory cells is inclined at the same orientation as the direction in which the word line extends.

Here, a trench capacitor will be described with reference to FIG. 6A through FIG. 6C. A trench capacitor is a type of capacitor having a MOS (Metal Oxide Semiconductor) structure (i.e., is a MOS capacitor). In a chip and the like of a semiconductor-based LSI (Large Scale Integrated circuit), in a case in which capacitor elements are formed in the electrical circuitry forming the LSI, then, generally, a capacitor having the MOS structure illustrated in FIG. 6 (or alternatively, an MIS (Metal Insulator Semiconductor) structure) is used.

Figure 6A:
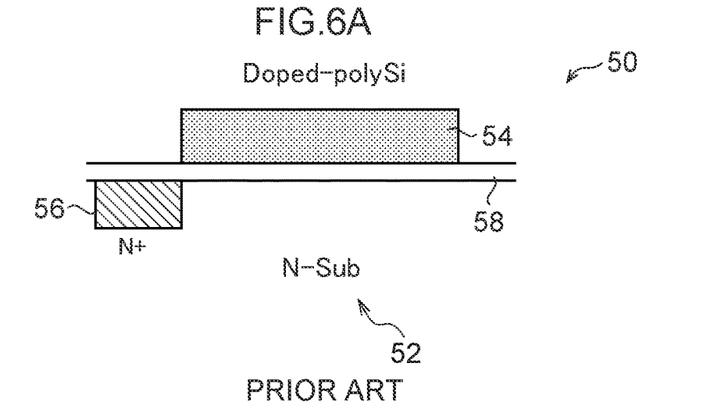
FIG. 6A is a cross-sectional view illustrating a MOS capacitor.

As illustrated in FIG. 6A, a MOS capacitor 50 is formed to include impurity diffusion polysilicon 54 (also denoted as 'Doped-polySi' in FIG. 6A), a diffusion layer 56 (in FIG. 6A, an example in which the conductivity is N+ conductivity is illustrated), and an insulation film 58 that are formed on a semiconductor substrate 52 (also denoted as 'N-Sub': in FIG. 6A, an example in which the conductivity is N− conductivity is illustrated). Electrodes having two capacities are connected to the impurity diffusion polysilicon 54 and the diffusion layer 56 illustrated in FIG. 6A. Note that the trench capacitor 30 was conceived on the basis of this MOS capacitor 50 in order to improve the packaging density of the electrical circuitry.

Figure 6B:
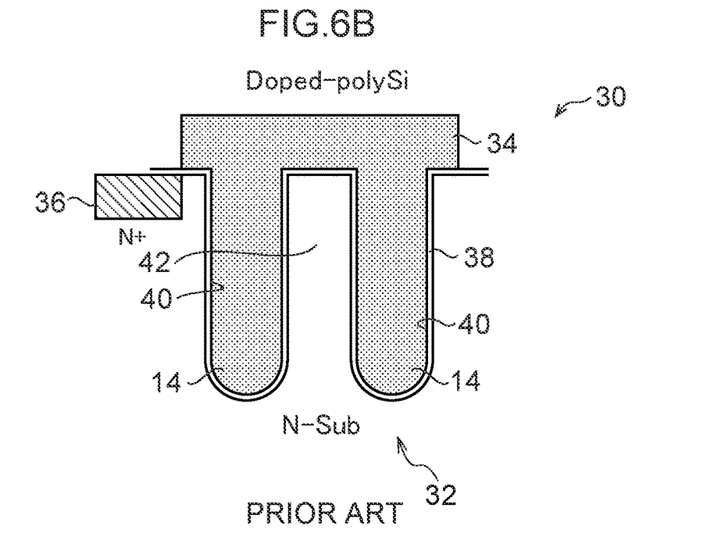
FIG. 6B is a cross-sectional view illustrating a trench capacitor.

As illustrated in FIG. 6B, the trench capacitor 30 includes impurity diffusion polysilicon 34, a diffusion layer 36, and an insulation film 38, and has a MOS structure. The characteristic of the trench capacitor 30 illustrated in FIG. 6B is the same as in the MOS capacitor 50. However, the area capacity efficiency is improved by creating grooves 40 in a semiconductor substrate 32 so as to form trenches 14, and utilizing side walls 42 (i.e., portions of the semiconductor substrate 32 between the grooves 40) of the grooves so as to shrink the planar surface area of the capacitor elements.

Figure 6C:
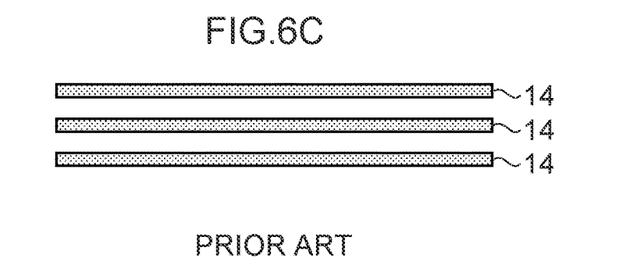
FIG. 6C is a plan view illustrating trenches of a trench capacitor.

Here, in the layout of the pattern of the grooves in the structure of the trench capacitor 30, as illustrated in FIG. 6C, the layout efficiency is increased by simply extending the grooves in a single direction so as to form a stripe pattern. However, when further improving the packaging density by using a groove layout such as that illustrated in FIG. 6C, the following situation may arise.

Namely, what is known as 'pattern collapse', and 'semiconductor wafer warpage' may occur. 'Pattern collapse' refers to the collapse of a pattern created in the semiconductor manufacturing process. Pattern collapse is likely to occur in patterns having a high wall height relative to the width. In the trench capacitor 30 illustrated in FIG. 6B as well, in a case in which the grooves 40 are being formed for the trenches 14 in the semiconductor device manufacturing process, in some cases, the side walls 42 between adjacent grooves 40 may collapse. This tends to occur more commonly in a case in which the grooves 40 have been formed deeper in order to increase the capacitance of the trench capacitor 30.

In contrast, wafer warpage is generated by the process to form the impurity diffusion polysilicon film 34. The impurity diffusion polysilicon 34 is formed during the semiconductor device manufacturing process by forming an impurity diffusion polysilicon film on the entire surface of a semiconductor wafer using LP-CVD (Low Pressure-Chemical Vapor Deposition) or the like, and then patterning this impurity diffusion polysilicon film. At this time, since an imbalance is generated in the volume of the impurity diffusion polysilicon between the front surface and the rear surface of the semiconductor wafer, after the subsequent heat processing has been completed, an imbalance is generated in the shrinkage factor caused by recrystallization of the impurity diffusion polysilicon 34, and the semiconductor wafer may become warped.

SUMMARY

The present disclosure provides a semiconductor wafer manufacturing method and a semiconductor device that, in a case in which multiple trench capacitors are formed in a semiconductor wafer, may prevent warpage of the semiconductor wafer, and may prevent pattern collapse from occurring in side walls of the trenches during the manufacturing process.

A first aspect of the present disclosure is a semiconductor wafer manufacturing method including: forming a plurality of trench capacitors at a main surface of a semiconductor wafer, wherein each of the plurality of trench capacitors is configured as unit cells that internally include unit trench capacitors, and wherein a length component in a predetermined direction of a layout pattern of trenches of the plurality of trench capacitors is made equivalent, within a fixed tolerance range, to a length component in a direction that intersects the predetermined direction.

A second aspect of the present disclosure is a semiconductor device comprising: trench capacitors, wherein layout pattern of trenches of the trench capacitors are formed such that a length component in a predetermined direction is made equivalent, within a fixed tolerance range, to a length component in a direction that intersects the predetermined direction.

According to the above-described aspects, a semiconductor wafer manufacturing method and a semiconductor device of the present disclosure, in a case in which multiple trench capacitors are being formed on a semiconductor wafer, may prevent warpage of the semiconductor wafer, and may prevent pattern collapse from occurring in side walls of the trenches during the manufacturing process.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments of the present disclosure will be described in detail with reference to the drawings. In the present exemplary embodiment, the layout patterns when seen in a plan view of the trenches of the trench capacitors are made as isotropic as possible. In other words, the layout patterns are made to be as non-directionally dependent as possible, in order to prevent the above-described 'pattern collapse' and 'semiconductor wafer warpage'.

First Exemplary Embodiment

A semiconductor wafer manufacturing method and a semiconductor device according to the present exemplary embodiment will now be described with reference to FIG. 1A and FIG. 1B. Trench capacitors are formed in a surface (i.e., in a circuit surface) of a semiconductor wafer 10 according to the present exemplary embodiment. In some cases, not only trench capacitors, but other circuit elements may also be formed in the semiconductor wafer 10. However, in the present exemplary embodiment, as an example, a case is described in which only trench capacitors are formed over the entire surface of the semiconductor wafer 10.

Figure 1A:
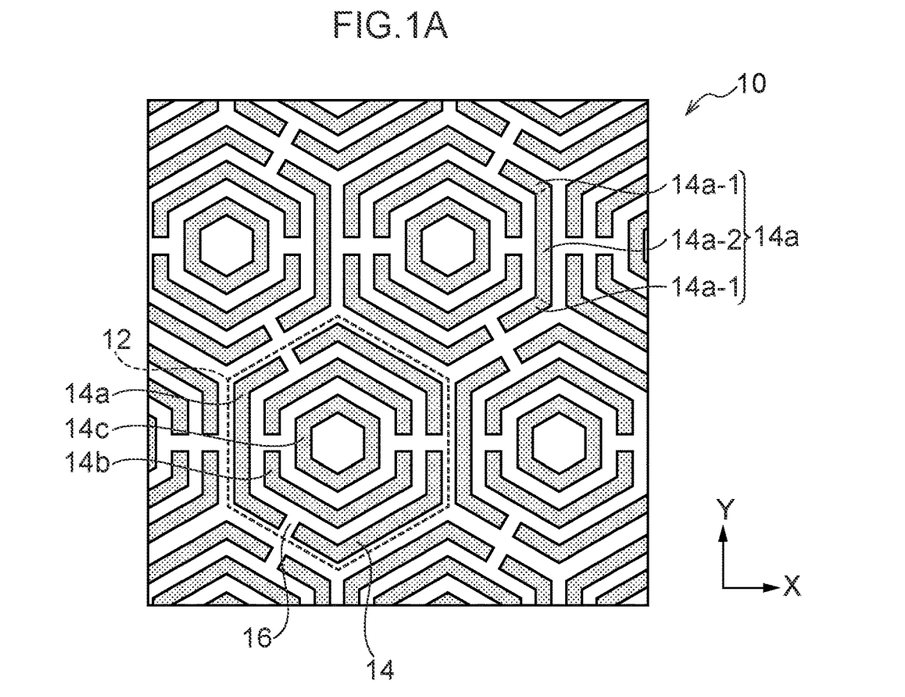
FIG. 1A is a plan view of a semiconductor wafer according to a first exemplary embodiment.

As illustrated in FIG. 1A, the trench capacitors according to the present exemplary embodiment are formed by laying out unit cells 12 (i.e., so as to fill an available space when seen at in a plan view), which are unit trench capacitors shaped as regular hexagons. Trenches 14 having a triple structure are formed in the unit cells 12. In other words, the trenches 14 of the unit cells 12 are formed by an outer-side trench 14a, an intermediate trench 14b, and an inner-side trench 14c. Slits 16 are formed in the outer-side trenches 14a and the intermediate trenches 14b, however, not in the inner-side trenches 14c.

Furthermore, the layout patterns (hereinafter, referred to as 'trench patterns') forming the trenches 14 are formed by combining unit patterns in which plural line segments that include line segments extending in at least two different directions are connected together. In other words, as illustrated in FIG. 1A, one trench pattern of the outer-side trenches 14a is formed by three unit patterns, namely, two unit patterns 14a-1, and one unit pattern 14a-2. The intermediate trenches 14b and the inner-side trenches 14c are also similarly formed by unit patterns. Note that, in the present exemplary embodiment, the term 'unit pattern' is also used to describe the single regular hexagon-shaped trench pattern forming the inner-side trench 14c.

In the semiconductor wafer 10 according to the present exemplary embodiment, unit cells 12 having the trench patterns formed in the above-described manner are laid together with no gaps therebetween. As a result, in a case in which an X axis and a Y axis are formed in the manner illustrated, for example, in FIG. 1B, a component of the length in the X-axial direction of the trench pattern of the trench capacitor is equivalent to a component of the length thereof in the Y-axial direction. The same fact applies to all of the six sides of the outer shape of the unit cells 12. As a result, the lengths of the trench patterns of the trench capacitors formed in the semiconductor wafer 10 according to the present exemplary embodiment are isotropic in six directions. Naturally, since the 'equivalent lengths' referred to here only need to be sufficiently equivalent so as to have no effect on the 'pattern collapse' and 'semiconductor wafer warpage' being targeted, 'equivalent within a fixed tolerance range' refers not only to each component simply being equivalent, but also means 'equivalent insofar as there are none of the aforementioned effects'. In other words, in the present exemplary embodiment, the isotropy of the trench pattern only needs to be within a range that is obtainable in the manufacturing process of the semiconductor wafer 10.

Here, the aforementioned 'pattern collapse' and 'semiconductor wafer warpage' will be described in more detail with reference to FIG. 2A and FIG. 2B. Additionally, an action of the layout pattern of the trench capacitors of the semiconductor wafer 10 illustrated in FIG. 1A will also be described.

Firstly, 'semiconductor wafer warpage' will be described in more detail. Semiconductor wafer warpage tends to occur more easily when trench patterns have been increased. In other words, the semiconductor wafer warpage tends to occur more easily in a case in which an area of trench structures within the same semiconductor wafer has been enlarged in order to increase the capacity of capacitor elements mounted within an electrical circuit.

Namely, in the example of the trench capacitor 30 illustrated in FIG. 6B, a film of the impurity diffusion polysilicon 34 is used as a counter electrode on one side of the semiconductor substrate 32 (namely, of a semiconductor wafer). However, as described above, since this film is formed via a normal LP-CVD process, a film having the same film thickness is formed on both the front surface and the rear surface of the semiconductor wafer. Due thereto, as described above, in a case in which a trench structure is formed in the front surface side of the semiconductor wafer, and the area of this trench structure is large, the surface area on the front surface side of the semiconductor wafer is greater than the surface area on the rear surface side thereof. As a result, the volume of the impurity diffusion polysilicon 34 on the front surface side is larger than the volume thereof on the rear surface side. The ratio of the volume of the impurity diffusion polysilicon 34 on the front surface side relative to the volume of the impurity diffusion polysilicon 34 on the rear surface side may reach a magnitude factor of several times to several tens of times depending on the design of the semiconductor device. Thus, a sizeable imbalance arises in the volumes of the impurity diffusion polysilicon 34 between the front surface and the rear surface of the semiconductor wafer.

In a case in which a semiconductor wafer in which the above-described imbalance has arisen undergoes heat processing, a volumetric shrinkage is generated due to the progress of crystallization of the impurity diffusion polysilicon film. Due thereto, volumetric shrinkage may become greater at the front surface side of the semiconductor wafer which has the greater film volume, and thus, the semiconductor wafer becomes warped by film stress. This warpage of the semiconductor wafer will now be described in more detail with reference to FIG. 2A and FIG. 2B.

Figure 2A:
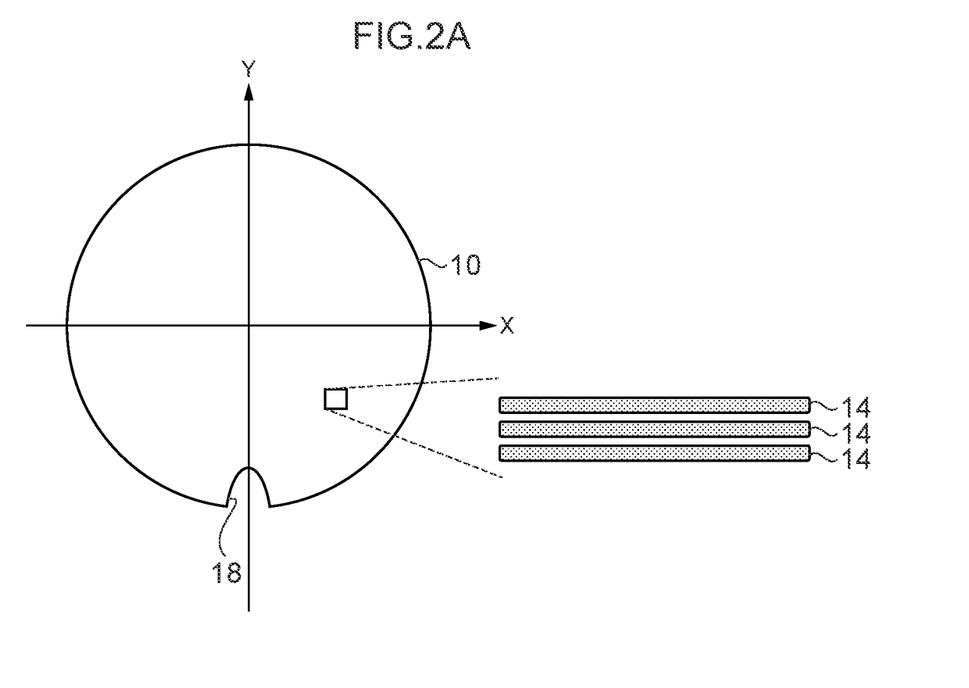
FIG. 2A is a view illustrating warpage of a semiconductor wafer that is caused by a trench.
Figure 2B:
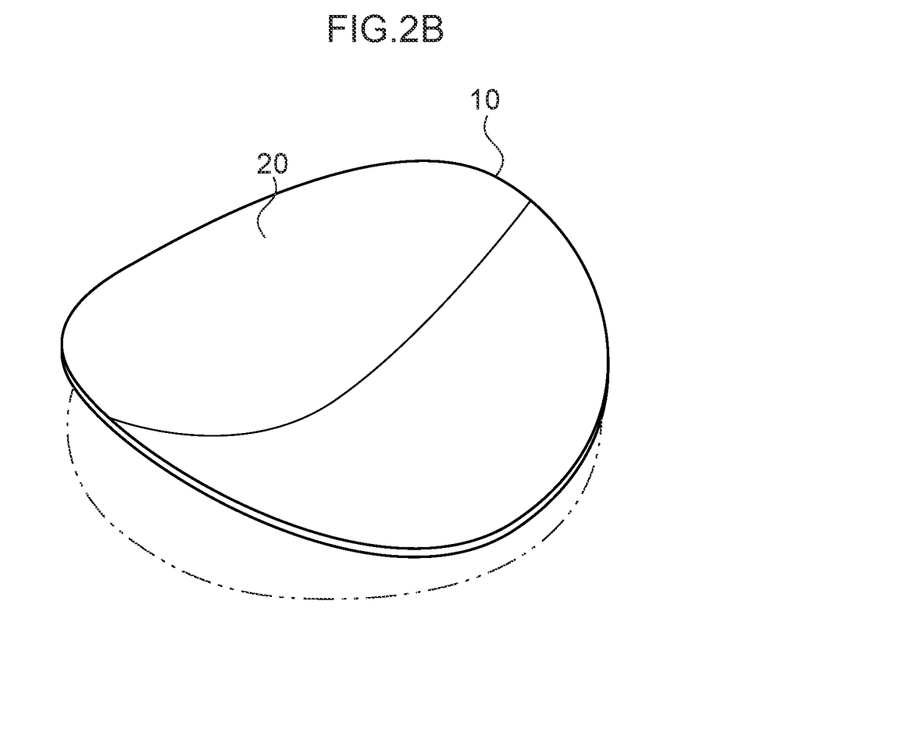
FIG. 2B is a perspective view illustrating a semiconductor wafer in a warped state.

FIG. 2A illustrates an example of a semiconductor wafer 10 in which are formed trenches 14 in which a longitudinal direction of the trench patterns extends in the X-axial direction. A recessed portion illustrated in FIG. 2A indicates a notch 18. However, the relationship illustrated between the notch 18 and the direction of the layout pattern of the trenches 14 is merely one example thereof, and is not limited to that illustrated in FIG. 2A. The above-described warpage of the semiconductor wafer 10 is dependent on the trench pattern, and since film stress acts on the trench side-walls, considerable stress acts in an orthogonal direction (namely, the Y-axial direction) relative to the longitudinal direction (namely, the X-axial direction) of the layout pattern of the trenches 14 as illustrated in FIG. 2A, and warpage of the semiconductor wafer occurs. In a case in which this warpage is generated, as illustrated in FIG. 2B, the semiconductor wafer 10 warps in a direction that causes the front surface 20 side to become concave-shaped (and causes the rear surface side to become convex-shaped).

In order to deal with this warpage of the semiconductor wafer 10, in the trench capacitors according to the present exemplary embodiment, anisotropy of the planar layout pattern of the trenches is prevented, and stress of the film that is embedded in the trench portions is uniformized in plural directions. In the present exemplary embodiment, since the outer shape of the layout patterns of the unit cells 12 is a regular hexagon shape, by employing this type of layout, film stress in the impurity diffusion polysilicon 34 that is embedded in the trenches may be dispersed in six directions and uniformized, and semiconductor wafer warpage in a particular direction may be prevented from occurring.

Next, 'pattern collapse' will be described in detail. In a case in which the layout dimensions (i.e., the thickness of side walls between grooves and the like) are reduced, or in a case in which the depth of the grooves is increased to further improve the area capacity efficiency via a striped trench pattern such as that illustrated in FIG. 6C, then the mechanical strength of the side walls 42, which are the walls created between the grooves after the grooves have been formed, is reduced. Here, in some cases, the patterns of the side walls 42 may collapse due to external forces generated during the manufacturing process (for example, water flows created during washing processing and the like). In a case in which this pattern collapse of the side walls 42 occurs, the device including the trench capacitors 30, in which the pattern collapse occurred may operate defectively. Further, debris from the pattern generated by the collapse may remain inside the semiconductor device manufacturing processing plant, and may become adhered to other manufactured products. Accordingly, it is necessary that pattern collapse during a semiconductor device manufacturing process be prevented from occurring as much as possible.

As described above, in the layout patterns of a trench capacitor according to the present exemplary embodiment, in response to the above-described situation, the layout patterns of the trench capacitors are prevented from exceeding a fixed length by providing the slits 16. This structure is based on the knowledge that the longer the length of the layout patterns, the easier it is for a collapse of the layout patterns to occur. Therefore, the layout patterns of the trench capacitors are prevented from exceeding a fixed length, and the occurrence of pattern collapse may be prevented by this structure.

In addition, in relation with the slits 16, as described above, in the layout patterns of the trench capacitors according to the present exemplary embodiment, since the ability of the side walls 42 to withstand force applied in a perpendicular direction relative to the wall surfaces thereof is increased by employing unit patterns having different directions (in other words, layout patterns such as the unit patterns 14*a*-1 and 14*a*-2 and the like), it becomes difficult for pattern collapse to occur. In other words, by creating a layout from patterns that employ unit patterns, the side walls 42 between trenches 14 have length components in plural directions, and the side walls 42 are consequently able to support each other. As a result, compared to a conventional stripe-shaped layout pattern, the ability to withstand external force is increased, namely, it becomes difficult for pattern collapse to occur. In other words, since the trench pattern according to the present exemplary embodiment is folded in several directions, it may withstand force applied to the side walls.

Namely, in the present exemplary embodiment, since the layout pattern that is formed by arranging the side walls 42 around the outermost periphery of each unit cell 12 adjacently to each other has a honeycomb structure, the side walls 42 inside the unit cells 12 are also connected to this honeycomb structure. As a result, high strength layout pattern may be formed.

The semiconductor wafer 10 according to the present exemplary embodiment is manufactured in the following manner. As described above, in some cases, circuit elements other than trench capacitors are formed on the semiconductor wafer 10. However, in the present exemplary embodiment, a case is described in which only trench capacitors are formed thereon. Firstly, an unprocessed semiconductor wafer is prepared. Next, the diffusion layer 36 which is connected to an electrode on one side of a trench capacitor is formed on a principal surface of this semiconductor wafer using photolithography and etching technology. Next, the grooves 40 that are used to form the trenches 40 are engraved via etching. Next, the insulating film 38 is formed on the surface of the semiconductor wafer 10 including the grooves 40 using an $SiO_2$ film (i.e., a silicon oxide film) or the like. Next, an impurity diffusion polysilicon film is formed on the surface of the semiconductor wafer 10, so that the grooves 40 are filled by this impurity diffusion polysilicon. Next, the impurity diffusion polysilicon 34 is formed by performing patterning processing on this impurity diffusion polysilicon using photolithography and etching technology. Next, electrodes that are connected to the impurity diffusion polysilicon 34 and the diffusion layer 36 are formed. By performing the above-described steps, the semiconductor wafer 10 according to the present exemplary embodiment including the trench capacitors in which the trenches 14 are formed is manufactured. After the trench capacitors have been formed therein, the semiconductor wafer 10 is divided into individual chips via dicing processing.

Figure 1B:
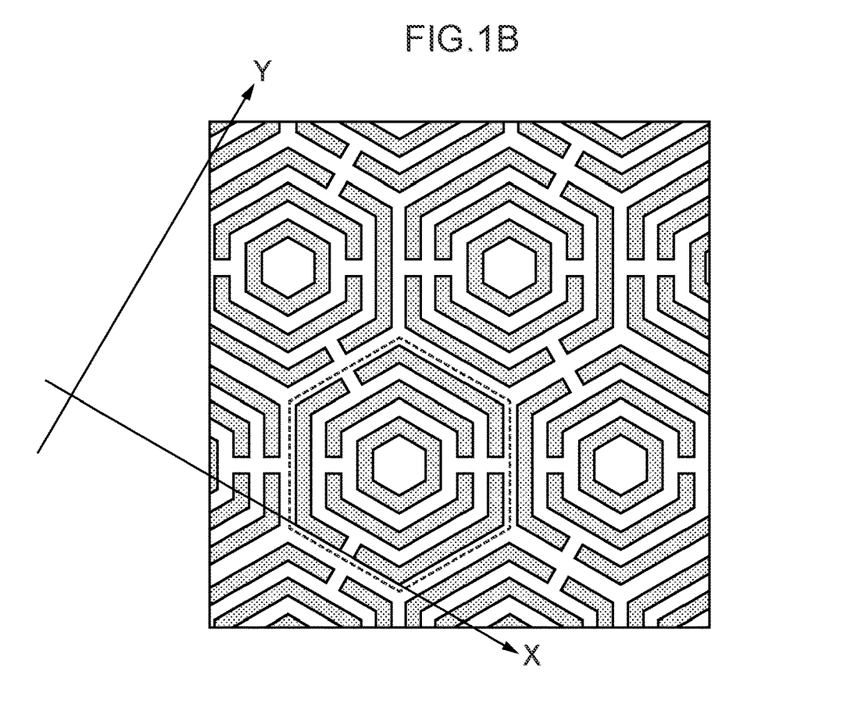
FIG. 1B is a view illustrating directional dependency of the length of a layout pattern of a trench in the semiconductor wafer according to the first exemplary embodiment.

In the method of manufacturing the semiconductor wafer 10 according to the present exemplary embodiment, the layout patterns illustrated in the above-described FIG. 1A and FIG. 1B are used as the layout patterns for the trench capacitors that are formed in the semiconductor wafer 10. Additionally, the semiconductor device according to the present exemplary embodiment is formed so as to include one or plural unit cells 12 that are manufactured using the above-described layout patterns. As a result, the semiconductor device according to the present exemplary embodiment includes trench capacitors in which the layout patterns of the trenches of the trench capacitors are formed such that a length component in a predetermined direction is equivalent, within a fixed tolerance range, to length components in directions that intersect the predetermined direction. Note that in the present exemplary embodiment, these 'intersecting directions' do not refer to a single intersecting direction, but include plural intersecting directions (for example, in the present exemplary embodiment, 'intersecting directions' refers to two directions).

Note also that, in the present exemplary embodiment, a configuration in which the slits 16 are provided in the trench patterns is illustrated and described, however, the present disclosure is not limited to this. Since the determination as to whether or not to provide the slits 16 may be made based on the possibility of pattern collapse occurring in the semiconductor wafer manufacturing process and the like, configuration in which the slits 16 are not provided are also possible. In such cases, for example, the outer side trenches 14a and the intermediate trenches 14b illustrated in FIG. 1A also form a regular hexagon-shaped trench patterns.

First Modified Example of the First Exemplary Embodiment

Figure 3A:
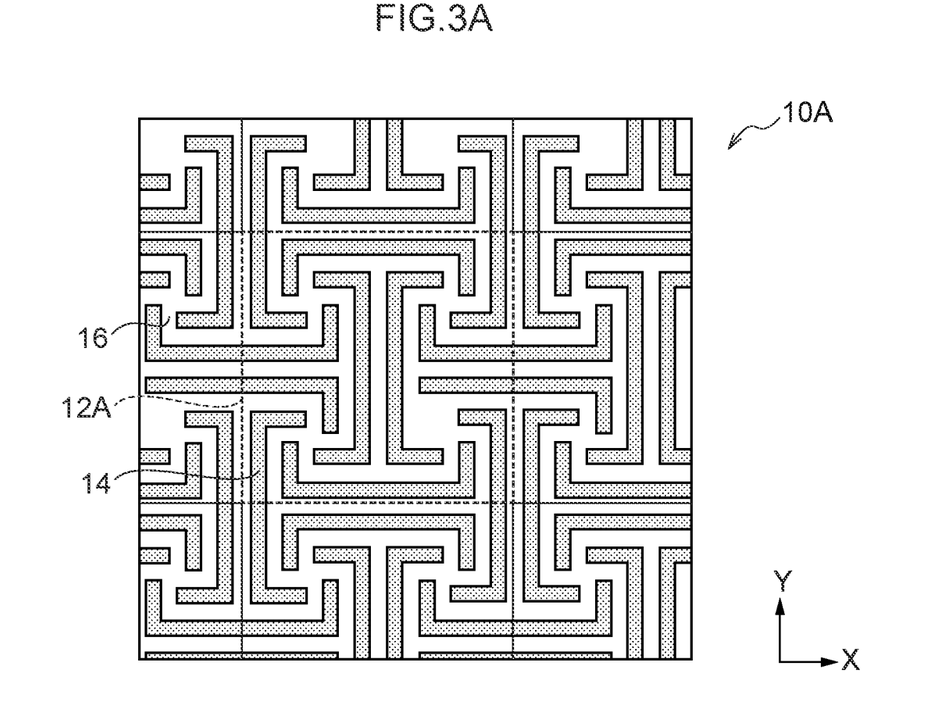
FIG. 3A is a plan view illustrating a first modified example of the semiconductor wafer according to the first exemplary embodiment.

The present exemplary embodiment will now be described with reference to FIG. 3A. As illustrated in FIG. 3A, a semiconductor wafer 10A according to the present exemplary embodiment includes trench capacitors that are formed by laying out unit cells 12A.

As illustrated in FIG. 3A, the unit cells 12A according to the present exemplary embodiment are formed having a rectangular outer shape (an example of a square outer shape is illustrated in FIG. 3A), and trenches 14 are formed internally in the unit cells 12. The layout patterns of the trenches 14 formed within the unit cells 12 according to the present exemplary embodiment are also formed by combining unit patterns in which plural line segments that include line segments extending in at least two different directions are connected together. In addition, the layout patterns of the trenches 14 are created so as to be isotropic. In other words, the layout patterns of the trenches 14 are created such that the lengths of the trench patterns within the unit cells 12A are not directionally dependent. By using unit patterns, the slits 16 are also formed.

More specifically, in the semiconductor wafer 10A according to the present exemplary embodiment, the layout patterns of the trenches 14 of the unit cells 12 are rotated 90 degrees, so that the length components of the trench patterns in the X-axial direction, and the length components of the trench patterns in the Y-axial direction are mutually equivalent. Further, the side walls 42 between the trenches 14 are formed of components extending in four directions. By employing this structure, film stress in the impurity diffusion polysilicon 34 is dispersed and warpage of the semiconductor wafer 10A may be prevented. Moreover, by employing this type of trench pattern, the trench patterns of the unit cells 12A mutually support each other so that, as a result, the capability of the side walls 42 to withstand external force may be improved. In addition, by combining unit patterns together in order to form the trench patterns, the capability of the side walls 42 to withstand external force may be improved even more.

Here, in the layout pattern of the trenches in the trench capacitors according to the present exemplary embodiment, as illustrated in FIG. 3A, the trench patterns of mutual adjacent unit cells 12A are connected together, so that the entire semiconductor wafer 10A is integrated as a single unit. By employing this layout pattern of the trench capacitors, in the semiconductor wafer 10A according to the present exemplary embodiment, the capacitance value of the trench capacitors may be further increased, and since mutually adjacent unit cells 12A are supporting each other, the occurrence of pattern collapse may be further prevented. In addition, because the trench patterns may be formed more precisely, the isotropy thereof may be further improved so that, as a result, the occurrence of semiconductor wafer warpage may be further prevented.

The semiconductor wafer 10A according to the present exemplary embodiment can also be manufactured via the same type of manufacturing method as that employed for the above-described semiconductor wafer 10. Further, as a result of the semiconductor device according to the present exemplary embodiment also containing one or plural unit cells 12A, this semiconductor device includes arranged trench capacitors in which a length component in a predetermined direction is equivalent, within a fixed tolerance range, to length components in directions that intersect the predetermined direction.

Second Modified Example of the First Exemplary Embodiment

A semiconductor wafer 10B according to the present exemplary embodiment will now be described with reference to FIG. 3B. The semiconductor wafer 10B is also provided with the rectangular unit cells 12B, however, the present exemplary embodiment gives an example of when the unit cells 12B are oblong-shaped. The trench capacitors according to the semiconductor wafer 10B are formed by laying the unit cells 12B on a surface of the semiconductor wafer 10B.

Figure 3B:
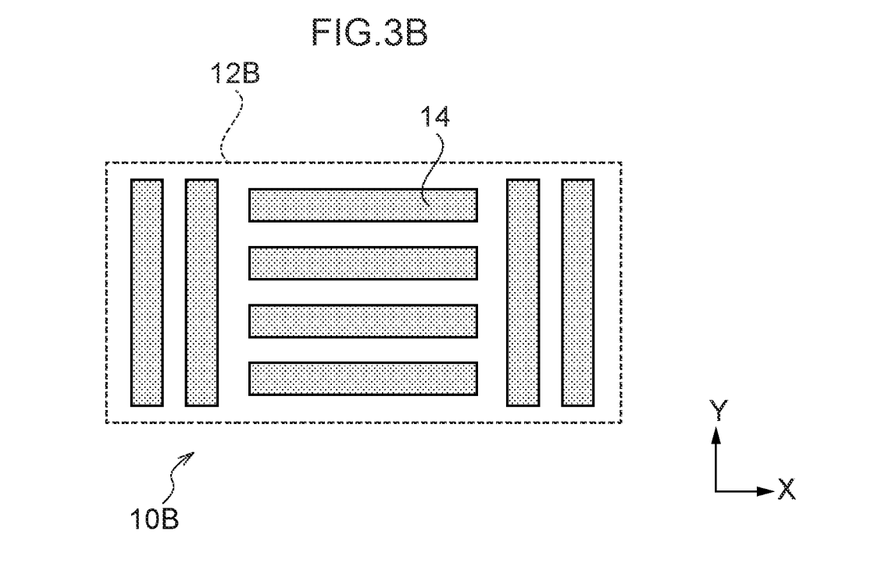
FIG. 3B is a plan view illustrating a second modified example of the semiconductor wafer according to the first exemplary embodiment.

As illustrated in FIG. 3B, the trench patterns contained within the unit cells 12B are formed by four patterns that extend in the X-axial direction, and four patterns that extend in the Y-axial direction. In addition, the length component of the trench patterns in the X-axial direction is equivalent, within a fixed tolerance range, to the length component of the trench patterns in the Y-axial direction. In the above exemplary embodiments, the respective lengths of the four trench patterns extending in the X-axial direction is equivalent to the respective lengths of the four trench patterns extending in the Y-axial direction. However, the present disclosure is not limited to this. In a case in which overall lengths are still the same lengths, the lengths of each trench pattern in the X-axial direction may be different from the lengths in the Y-axial direction.

Since the trench patterns of the unit cells 12B are not formed by combining unit patterns together, the capability thereof to withstand external force against the side walls between adjacent trenches 14 is unchanged from that of a conventional example in which same-sized trenches are arranged in a stripe formation. However, the film stress dispersion effect of the impurity diffusion polysilicon 34 is improved may be comparison with the conventional technology. Accordingly, the present exemplary embodiment may be used in applications in which pattern collapse is comparatively not effective, and designing a trench pattern layout that prevents semiconductor wafer warpage may be simplified.

The semiconductor wafer 10B according to the present exemplary embodiment can also be manufactured via the same type of manufacturing method as that employed for the above-described semiconductor wafer 10. Further, as a result of the semiconductor device according to the present exemplary embodiment also containing one or plural unit cells 12B, this semiconductor device includes trench capacitors in which a length component in a predetermined direction is equivalent, within a fixed tolerance range, to length components in directions that intersect the predetermined direction.

Second Exemplary Embodiment

A semiconductor wafer manufacturing method and a semiconductor device according to the present exemplary embodiment will now be described with reference to FIG. 4A and FIG. 4B. In the trench capacitors according to the present exemplary embodiment, regular hexagon-shaped unit cells 12C are laid while changing the orientations thereof.

Figure 4A:
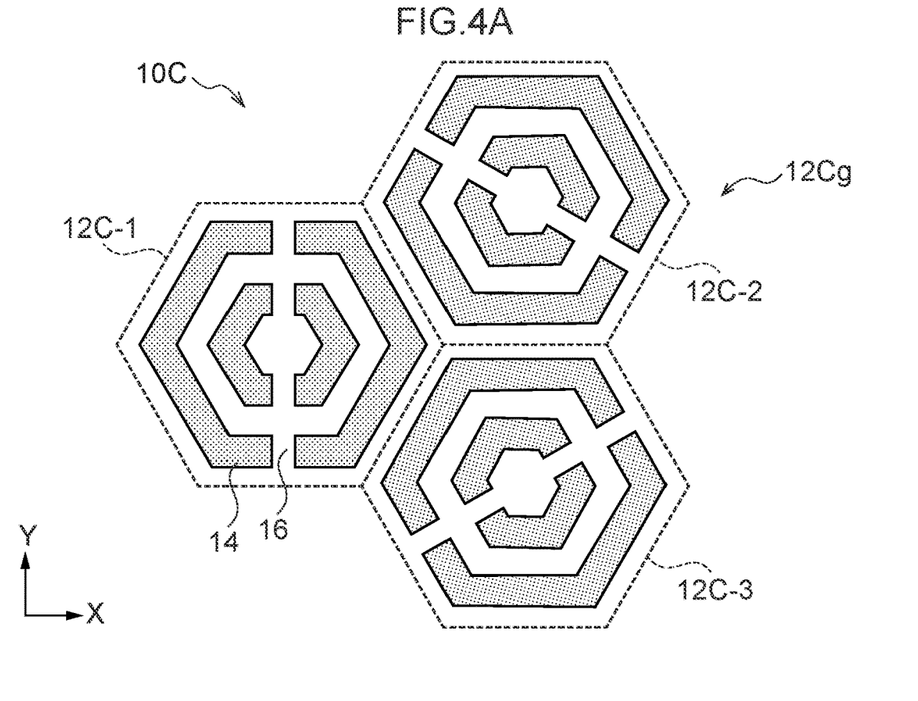
FIG. 4A is a plan view of a semiconductor wafer according to a second exemplary embodiment.
Figure 4B:
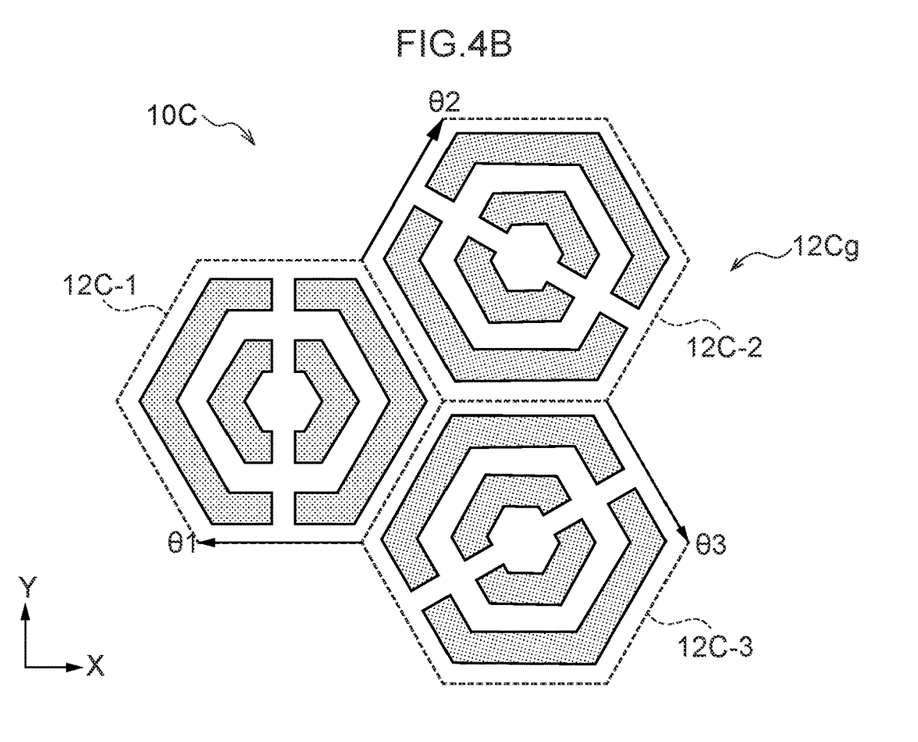
FIG. 4B is a plan view illustrating a rotation of a unit cell of the semiconductor wafer according to the second exemplary embodiment.

As illustrated in FIG. 4A, the trench capacitors according to the present exemplary embodiment are formed by taking a group of unit cells 12C-1, 12C-2, and 12C-3 that are positioned adjacent to each other, and whose three layout directions are mutually different as forming a single unit (hereinafter, this unit may be referred to as a 'group unit cell 12Cg'), and laying these group unit cells 12Cg on a semiconductor wafer 10C. Namely, as illustrated in FIG. 4B, if the one side out of the sides forming the outer shape of the unit cell 12C-1 that is parallel with the X-axial direction is taken as a reference, then the unit cell 12C-1 is oriented such that this reference side extends in a −X direction, the unit cell 12C-2 is oriented such that this reference side is rotated clockwise 120 degrees from the −X direction, and the unit cell 12C-3 is oriented such that this reference side is rotated clockwise 240 degrees from the −X direction.

As illustrated in FIG. 4A, each of the unit cells 12C-1, 12C-2, and 12C-3 (hereinafter, these may be referred to collectively as 'unit cells 12C') are formed by a double trench pattern. In the unit cell 12C according to the present exemplary embodiment, for example, the length component in the X-axial direction of the trench patterns of the unit cell 12C-1 illustrated in FIG. 4A is equivalent to the length component in the Y-axial direction thereof. Namely, the length component of the trench patterns of the unit cells 12C is not directionally dependent. In this way, the present exemplary embodiment may be applied in cases in which the length of the trench patterns of the unit cells is not directionally dependent, and in cases in which this length is slightly directionally dependent. In particular, the present embodiment is useful for compensating a slight amount of directional dependency present in trench patterns. In other words, any slight remaining imbalance in the directional dependency of the trench patterns may be uniformized over an entire group of unit cells 12C by rotating mutually adjacent unit cells 12C relative to each other. Moreover, since the trench patterns of the present exemplary embodiment are formed by the above-described unit patterns, they may also withstand pattern collapse.

The semiconductor wafer 10C according to the present exemplary embodiment can also be manufactured via the same type of manufacturing method as that employed for the above-described semiconductor wafer 10. In addition, as a result of the semiconductor device according to the present exemplary embodiment also containing one or plural unit cells 12Cg, this semiconductor device includes arranged trench capacitors in which a length component in a predetermined direction is equivalent, within a fixed tolerance range, to length components in directions that intersect the predetermined direction.

First Modified Example of the Second Exemplary Embodiment

Figure 5A:
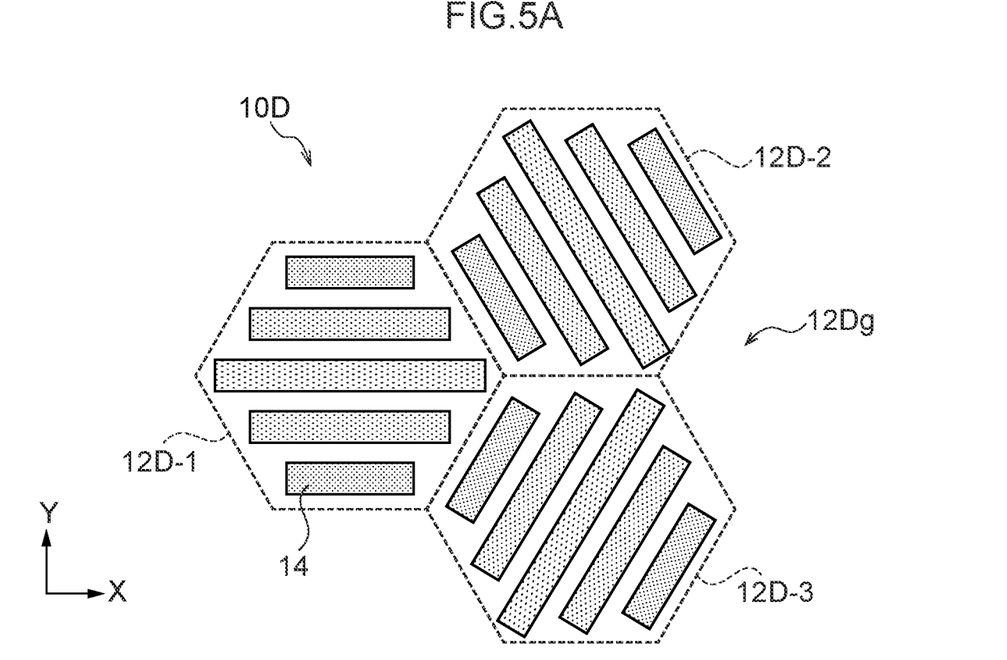
FIG. 5A is a plan view illustrating a first modified example of the semiconductor wafer according to the second exemplary embodiment.

A semiconductor wafer manufacturing method and a semiconductor device according to the present exemplary embodiment will now be described with reference to FIG. 5A. As illustrated in FIG. 5A, trench capacitors that are formed by laying out group unit cells 12Dg are formed in a semiconductor wafer 10D according to the present exemplary embodiment.

As illustrated in FIG. 5A, a group unit cell 12Dg is formed so as to include unit cells 12D-1, 12D-2, and 12D-3 (hereinafter, referred to collectively as 'unit cells 12D') that have a regular hexagon-shaped outer shape. The unit cells 12D include trenches 14 having three different lengths that extend in a specific direction (for example, in the X-axial direction in the unit cell 12D-1). In other words, the lengths of the trench patterns inside the unit cells 12D have directionality. Even in a case in which the lengths of the trench patterns inside the unit cells 12D are not isotropic, since the unit cells 12D are disposed after being rotated in three mutually different directions, as is illustrated by the unit cells 12D-1, 12D-2, and 12D-3, the directional dependency of the lengths of the trench patterns can be eliminated (i.e., the lengths of the trench patterns are uniformized). Namely, when looking at an overall group unit cell 12Dg, the length components in the X-axial direction of the layout patterns of the trenches 14 are equivalent to the length components in the Y-axial direction thereof. As a result, stress during the manufacturing process of the semiconductor wafer 10D may be alleviated, and warpage of the semiconductor wafer may be prevented.

As is described above, the present exemplary embodiment that uses group unit cells which are formed by plural unit cells is more effective if applied to a case in which the lengths of the trench patterns within the unit cells are directionally dependent. Moreover, in the present exemplary embodiment, the trench patterns may be disposed without the directional dependency of the interior of the unit cells, and that the trench patterns inside the unit cells can be set to a simple pattern such as, for example, a stripe pattern or the like.

The semiconductor wafer 10D according to the present exemplary embodiment can also be manufactured via the same type of manufacturing method as that employed for the above-described semiconductor wafer 10. In addition, as a result of the semiconductor device according to the present exemplary embodiment also containing one or plural unit cells 12Dg, this semiconductor device includes arranged trench capacitors in which a length component in a predetermined direction is equivalent, within a fixed tolerance range, to length components in directions that intersect the predetermined direction.

Second Modified Example of the Second Exemplary Embodiment

A semiconductor wafer manufacturing method and a semiconductor device according to the present exemplary embodiment will now be described with reference to FIG. 5B. As is illustrated in FIG. 5B, trench capacitors that are formed by laying out group unit cells 12Eg are formed in a semiconductor wafer 10E according to the present exemplary embodiment.

Figure 5B:
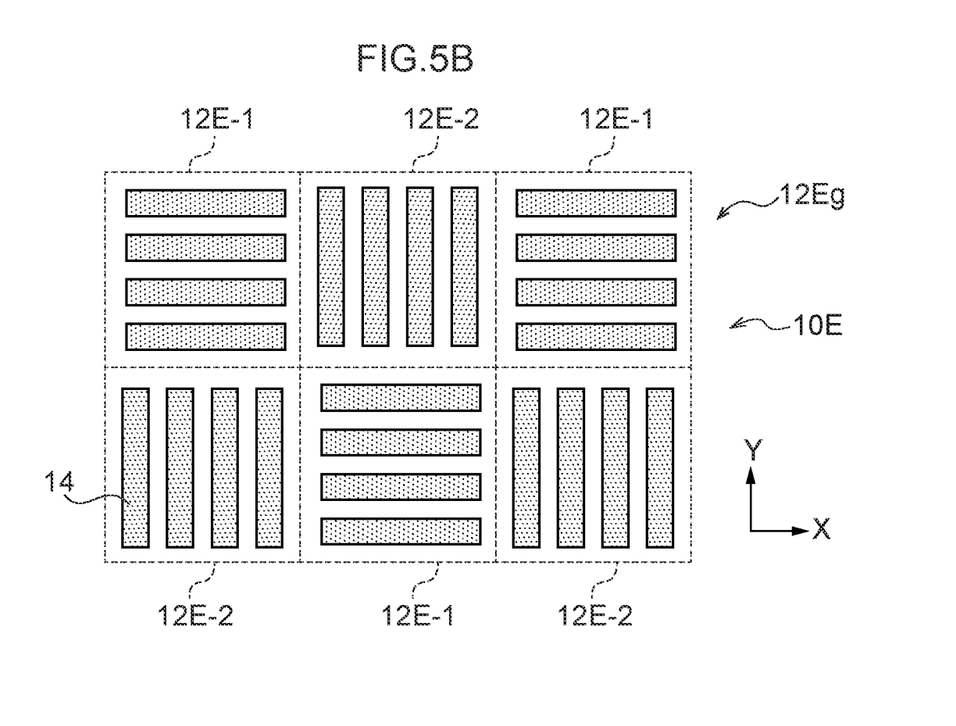
FIG. 5B is a plan view illustrating a second modified example of the semiconductor wafer according to the second exemplary embodiment.

As is illustrated in FIG. 5B, a group unit cell 12Eg is formed so as to include three each of unit cells 12E-1 and 12E-2 (hereinafter, referred to collectively as 'unit cells 12E') that have a square outer shape. The unit cells 12E include three trenches 14 that extend in a specific direction (in the X-axial direction in the unit cells 12E-1 and in the Y-axial direction in the unit cells 12E-2). In other words, the lengths of the trench patterns inside the unit cells 12E have directionality. Even in a case in which the lengths of the trench patterns inside the unit cells 12E are not isotropic, as is illustrated in FIG. 5B, since the unit cells 12E are disposed with the unit cells 12E-1 and 12E-2 being rotated in two different directions that are mutually offset from each other by 90 degrees, the directional dependency of the lengths of the trench patterns may be eliminated (i.e., the lengths of the trench patterns are uniformized). In other words, when looking at an overall group unit cell 12Eg, the length components in the X-axial direction of the layout patterns of the trenches 14 are equivalent to the length components in the Y-axial direction thereof. As a result, stress during the manufacturing process of the semiconductor wafer 10E is uniformized over the entire wafer (i.e., is alleviated), and warpage of the semiconductor wafer may be prevented.

Note that the layout patterns of the trenches 14 illustrated in FIG. 5B may also be expressed as a pattern in which the unit cells 12E, or alternatively, individual groups made up of one unit cell 12E-1 and one unit cell 12E-2 are arranged in a zigzag pattern. In addition, in FIG. 5B, a case in which the group unit cells 12Eg are formed by six unit cells 12E has been described. However, the present disclosure is not limited to this. Each group unit cell 12Eg may be formed by the four unit cells 12E on the left side of the unit cell 12Eg illustrated in FIG. 5B.

The semiconductor wafer 10E according to the present exemplary embodiment can also be manufactured via the same type of manufacturing method as that employed for the above-described semiconductor wafer 10. In addition, as a result of the semiconductor device according to the present exemplary embodiment also containing one or plural unit cells 12Eg, this semiconductor device includes arranged trench capacitors in which a length component in a predetermined direction is equivalent, within a fixed tolerance range, to length components in directions that intersect the predetermined direction.

Note that, in each of the above-described embodiments, cases in which the unit cells 12 (i.e., 12A through 12E) are arranged such that there are no gaps between adjacent unit cells 12 have been described. However, the present disclosure is not limited to this. The unit cells 12 (i.e., 12A through 12E) may be arranged such that a gap is provided between adjacent unit cells 12. In such case, for example in the case illustrated in FIG. 4A and FIG. 4B, the group unit cells 12Cg may be arranged discretely, or alternatively, the same number of each of the individual unit cells 12C-1, 12C-2, and 12C-3 may be arranged discretely.

Further, an aspect of the present disclosure is a semiconductor device including: trench capacitors, wherein layout pattern of trenches of the trench capacitors are formed such that a length component in a predetermined direction is made equivalent, within a fixed tolerance range, to a length component in a direction that intersects the predetermined direction.

Exemplary embodiments of the present disclosure have been described above, however, the present disclosure is not limited to these. Various modifications and the like may be made to the present disclosure insofar as they do not depart from the spirit or scope of the present disclosure.

What is claimed is:

1. A semiconductor wafer manufacturing method comprising:
    forming a plurality of trench capacitors at a main surface of a semiconductor wafer,
    wherein each of the plurality of trench capacitors is configured as unit cells that internally include unit trench capacitors, and
    wherein a length component in a predetermined direction of a layout pattern of trenches of the plurality of trench capacitors is made equivalent, within a fixed tolerance range, to a length component in a direction that intersects the predetermined direction,
    wherein each unit cell includes a first trench including a slit that divides a length of the first trench to be within a predetermined upper-limit value, and a second trench including a slit that divides a length of the second trench to be within the predetermined upper-limit value, the second trench disposed adjacent to the first trench at an inner side of the first trench with respect to a center of the unit cell with a space between the first and second trenches.

2. The semiconductor wafer manufacturing method according to claim 1, wherein:
    the length component in the predetermined direction of the layout pattern of the trenches of the plurality of trench capacitors is made different from the length component in the direction that intersects the predetermined direction, and by disposing each of the plurality of unit cells after rotating relatively to each other, the length component in the predetermined direction of the layout pattern of the trenches of the plurality of trench capacitors is made equivalent, within the fixed tolerance range, to the length component in the direction that intersects the predetermined direction.

3. The semiconductor wafer manufacturing method according to claim 2, wherein the layout pattern of the trenches in a layout pattern of the unit trench capacitors includes the slits that are used to limit the length of the trenches to not more than the predetermined upper-limit value.

4. The semiconductor wafer manufacturing method according to claim 3, wherein the layout pattern of the trenches in the layout pattern of the unit trench capacitors is formed by combining unit patterns in which a plurality of line segments that include line segments extending in at least two different directions are connected together.

5. The semiconductor wafer manufacturing method according to claim 1, wherein the length component in the predetermined direction of the layout pattern of the trenches of the plurality of trench capacitors is made equivalent, within the fixed tolerance range, to the length component in the direction that intersects the predetermined direction as a result of the length component in the predetermined direction of the layout pattern of the trenches of the unit trench capacitors being made equivalent, within the fixed tolerance range, to the length component in the direction that intersects the predetermined direction.

6. The semiconductor wafer manufacturing method according to claim 2, wherein an outer shape of the unit cells is formed as a regular polygonal shape, and the unit cells are laid within a plane such that there are no gaps between adjacent unit cells of the unit cells.

7. The semiconductor wafer manufacturing method according to claim 2, wherein the layout patterns of the trenches of the unit trench capacitors of each of the plurality of unit cells are mutually independent.

8. The semiconductor wafer manufacturing method according to claim 1, wherein the layout patterns of the trenches of the unit trench capacitors of each of the plurality of unit cells are in mutual contact with each other.

9. The semiconductor wafer manufacturing method according to claim 2, wherein each of the unit trench capacitors includes plural trench capacitors from among the plurality of trench capacitors.

* * * * *